United States Patent
Lin et al.

(10) Patent No.: US 6,775,189 B2
(45) Date of Patent: Aug. 10, 2004

(54) OPTION FUSE CIRCUIT USING STANDARD CMOS MANUFACTURING PROCESS

(75) Inventors: Yen-Tai Lin, Hsin-Chu (TW); Jie-Hau Huang, Tai-Chung Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 51 days.

(21) Appl. No.: 10/248,194

(22) Filed: Dec. 25, 2002

(65) Prior Publication Data

US 2004/0125638 A1 Jul. 1, 2004

(51) Int. Cl.[7] .................................................. G11C 7/00
(52) U.S. Cl. .............................. 365/189.07; 365/225.7
(58) Field of Search ........................ 365/189.07, 189.08, 365/189.05, 225.7

(56) References Cited

U.S. PATENT DOCUMENTS 6,525,972 B2 * 2/2003 Yanagisawa ............ 365/189.09

* cited by examiner

*Primary Examiner*—Thong Le
(74) *Attorney, Agent, or Firm*—Winston Hsu

(57) ABSTRACT

An option fuse circuit using standard CMOS manufacturing processes includes a latch for latching signals, which includes a first node and a second node. The option fuse circuit also includes a comparator, which includes two input nodes and an output node. The comparator receives signals input at the two input nodes from the first and the second nodes, and compares the two signals in order to output a comparison signal. The option fuse circuit further includes two logic cells for storing non-volatile data. The logic cells include a word line node and a bit line node. The word line nodes are electrically connected to the output node of the comparator, while the bit line nodes are electrically connected to the first and the second nodes, respectively.

17 Claims, 8 Drawing Sheets

OPTION FUSE CIRCUIT USING STANDARD CMOS MANUFACTURING PROCESS

BACKGROUND OF INVENTION

1. Field of the Invention

The invention relates to an option fuse circuit, and more particularly, to an option fuse circuit fabricated using standard CMOS manufacturing processes.

2. Description of the Prior Art

Within a variety of electronic products, memories (for example, ROM, DRAM, and SRAM, etc) have always been one of the most important components, as they perform a function of storing volatile and non-volatile data. A memory comprises a plurality of memory cells, each of which is used for storing one bit of digital data. The plurality of memory cells are usually lined up in an array, and manufactured in a form of an integrated circuit using semi-conductor manufacturing processes.

During ordinary semi-conductor manufacturing processes, because it is not possible for a yield of production of integrated circuits to reach 100%, a certain percentage of defective products is expected. Therefore, during the flow from manufacturing to shipping of ICs, a product-testing step is critical and not ignorable. Only through the process of product testing can malfunctioning or unusable products due to the yield issue in a semi-conductor manufacturing process be filtered out and eliminated, guaranteeing that customers are shipped well-functioning products. Through the above description one can see that product testing is extremely important in the semi-conductor manufacturing process.

Since there are a huge number of memory cells in a memory (usually from tens to hundreds of megabytes, for example, 64 Mb or 128 Mb, etc), the probability of a malfunction happening in at least one among these many memory cells is quite high. If there is one malfunctioning memory cell in a memory, the memory will be treated as a defected product and become unusable. This causes trouble for memory manufacturers. Therefore, in general, during designing a memory, beside a main memory cell array an additional set of redundant memory cells is appended, and dedicated circuitry is used for controlling and selecting connections between the set of redundant memory cells and the memory cell array. By utilizing this technique, when some memory cells at certain addresses of the memory cell array are found to malfunction during the product-testing step, the dedicated circuitry can be used for controlling the set of redundant memory cells to replace the function of those malfunctioning memory cells. As a result, it is not necessary to eliminate the memory just because of a small fraction of malfunctioning memory cells, and costs are reduced. The above-mentioned dedicated circuitry is usually called an option fuse circuit.

Please refer to FIG. 1. FIG. 1 shows a diagram of an option fuse circuit 10 according to the prior art. The option fuse circuit 10 comprises a PMOS transistor 12, a PMOS transistor 14, an NMOS transistor 16, and an option fuse 18. The transistors 14, 16 are electrically connected to each other to form an inverter, wherein two gates are connected to each other to form an input node of the inverter, and two drains are connected to each other to form an output node of the inverter. A drain of the transistor 12 and one end of the option fuse 18 are electrically connected to the input node of the inverter, a gate of the transistor 12 is electrically connected to the output node of the inverter, and the output node of the inverter is pulled out as an output node Vout of the option fuse circuit 10. Finally, sources of the transistors 12, 14 are electrically connected to a system voltage Vdd, and a source of the transistor 16 and the other end of the option fuse 18 are electrically connected to ground Vss.

Please refer to FIG. 2A and FIG. 2B. FIG. 2A shows a layout diagram of the option fuse 18 in FIG. 1. The option fuse 18 is usually laid out using a metal line segment or a poly line segment, and as shown in FIG. 2B, during the product-testing process the option fuse 18 can be cut by a laser according to testing results. Since the output node Vout of the option fuse circuit 10 shows different output signal values between situations of the option fuse 18 being cut and not being cut (Take the option fuse circuit 10 in FIG. 1 for example, when the option fuse 18 is not cut, Vout shows a logical "1", i.e. a high voltage. When the option fuse 18 is cut, Vout shows a logical "0", i.e. a low voltage), output signal values of a plurality of the option fuse circuits 10 in the memory can be used to encode a combination of the redundant memory cells replacing the malfunctioned memory cells in the memory array.

However, in order to prevent the destruction of surrounding devices due to the laser cutting, it is usually necessary to preserve a sufficient space around the layout of the option fuse 18 (as shown in FIG. 2A and FIG. 2B, an area of 5 $\mu$m×5 $\mu$m), and in order to proceed the laser cutting, an oxide layer on top of the option fuse 18 needs to be excavated to make an opening. However, the opening gives an entrance for contaminants, such as water vapor, to destroy surrounding devices, and this, as a result, lowers the reliability of these surrounding devices. This phenomenon is most significant when a number of the option fuse circuits 10 in the memory dramatically increases following a increasing memory storage space, because more option fuse circuits 10 means a larger number of openings, and hence greater opportunity of contamination of devices in the memory. On the other hand, laser cutting is relatively a much more time-consuming procedure since a large number of option fuses 18 need to be cut one after another during the product-testing process, and this causes a significantly long testing time.

In order to avoid the above-mentioned problems caused by using laser-cutting technology in an option fuse circuit, technologies according to the prior art also adopt flash memories in conjunction with proper circuit designs to realize the option fuse circuit. But since the manufacturing method of flash memories is not compatible with a standard CMOS manufacturing process, and has to include an additional polysilicon layer, the manufacturing costs are high.

SUMMARY OF INVENTION

It is therefore a primary objective of the claimed invention to provide an option fuse circuit fabricated using standard CMOS manufacturing processes, so as to use only one polysilicon layer during the manufacturing process and not require laser cutting technology during testing, to solve the above-mentioned problems.

According to the claimed invention, an option fuse circuit manufactured with standard CMOS manufacturing processes comprises a latch comprising a first node and a second node, and being used for latching signals at the first and the second nodes; a comparator comprising two input nodes and an output node, wherein the two input nodes are electrically connected to the first and the second nodes respectively, the comparator being used for inputting the signals at the first and the second nodes respectively, and outputting a comparison signal by comparing the two signals; a first logic cell for storing a non-volatile data, comprising a first word line node and a first bit line node, wherein the first word line node is electrically connected to the output node of the comparator in order to input the comparison signal, the first bit line node being electrically connected to the first node; and a second logic cell for storing a non-volatile data, comprising a second word line node and a second bit line node, wherein the second word line node is electrically connected to the output node of the comparator in order to input the comparison signal, the second bit line node being electrically connected to the second node. The data stored in the first logic cell and the data stored in the second logic cell are complementary to each other.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
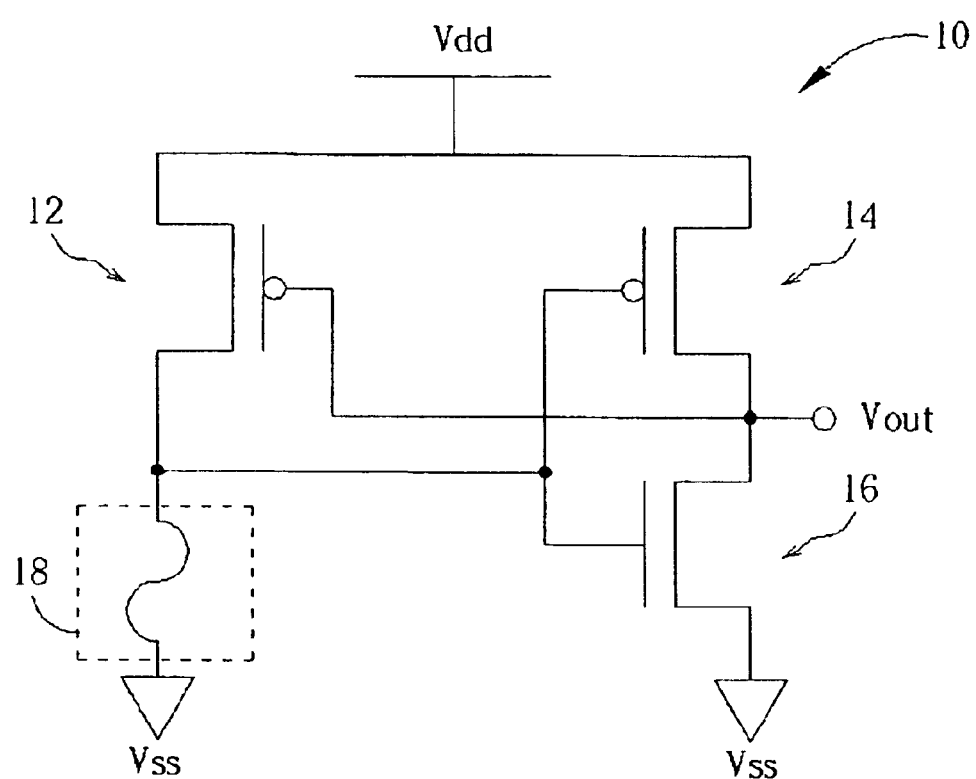
FIG. 1 is a diagram of an option fuse circuit according to the prior art.
Figures 2A, 2B:
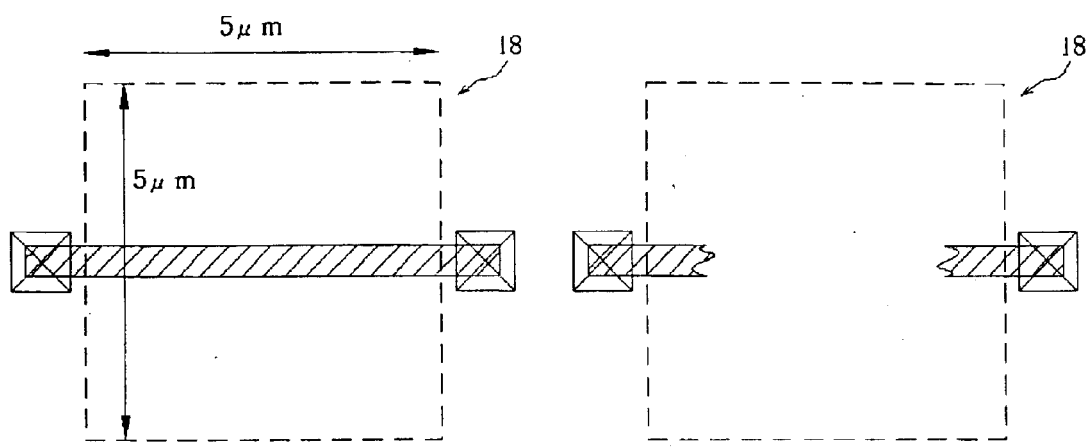
FIG. 2A is a layout diagram of the option fuse in FIG. 1 when not cut.
FIG. 2B is a layout diagram of the option fuse in FIG. 1 when cut.
Figure 3:
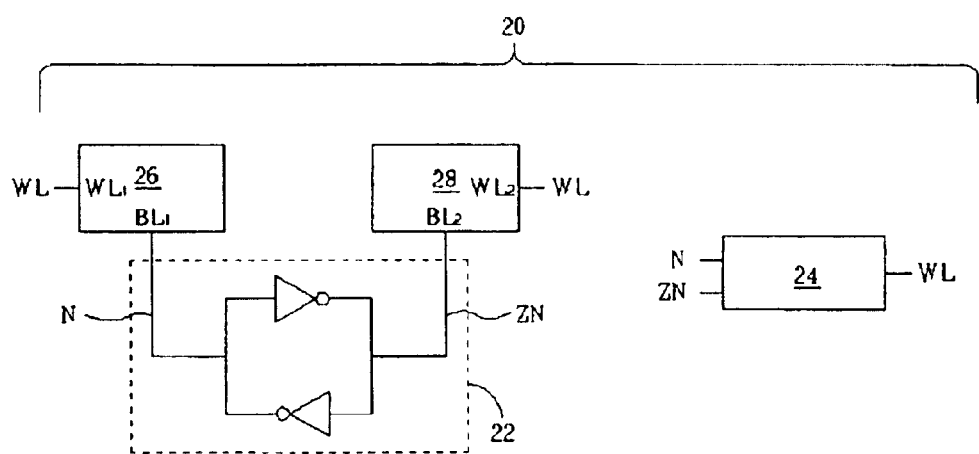
FIG. 3 is a diagram of an option fuse circuit according to the present invention.

Please refer to FIG. 3. FIG. 3 shows an option fuse circuit 20 according to the present invention. The option fuse circuit 20 comprises a latch 22 comprising a first node N and a second node ZN, used for latching signals at the first and the second nodes N, ZN; a comparator 24 comprising two input nodes and an output node, wherein the two input nodes are electrically connected to the first and the second nodes N, ZN, respectively. The comparator 24 is used for inputting the signals at the first and the second nodes N, ZN from the two input nodes respectively, comparing the two signals so as to output a comparison signal WL at the output node. The option fuse circuit 20 also comprises a first logic cell 26 for storing a non-volatile data. The first logic cell 26 comprises a first word line node $WL_1$ and a first bit line node $BL_1$, wherein the first word line node $WL_1$ is electrically connected to the output node of the comparator 24 for inputting the comparison signal WL, and the first bit line node $BL_1$ is electrically connected to the first node N. The option fuse circuit 20 further comprises a second logic cell 28 for storing a non-volatile data. The second logic cell 28 comprises a second word line node $WL_2$ and a second bit line node $BL_2$, wherein the second word line node $WL_2$ is electrically connected to the output node of the comparator 24 for inputting the comparison signal WL, and the second bit line node $BL_2$ is electrically connected to the second node ZN. Please note that the latch 22 is usually formed by connecting two inverters reversely, as shown in FIG. 3. In the following paragraphs, operations of the option fuse circuit 20 will be described in detail using a preferred embodiment of the present invention.

Figure 4:
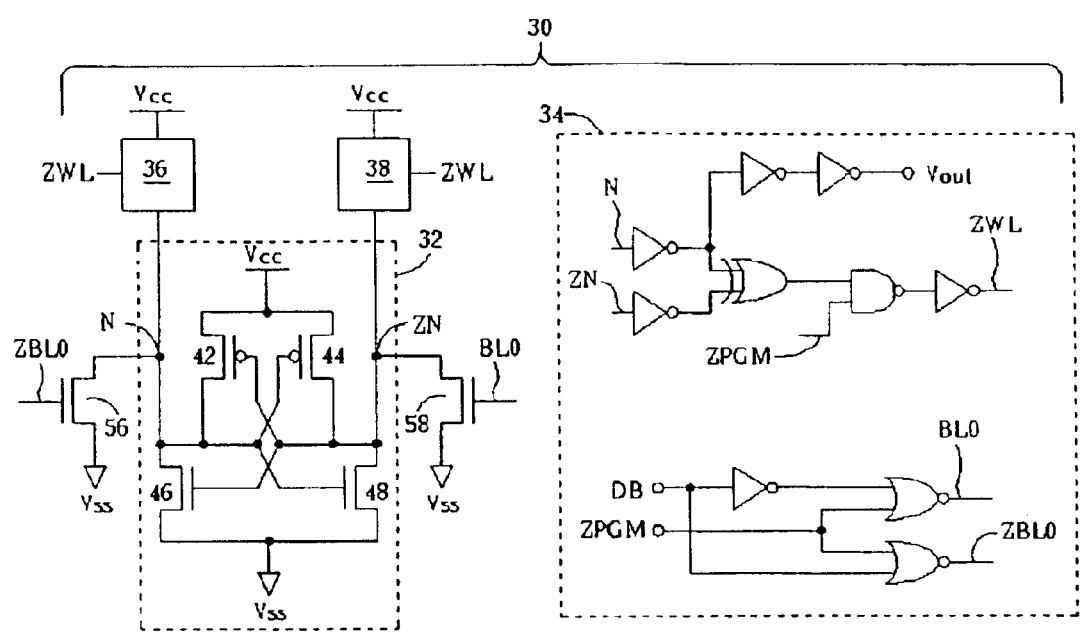
FIG. 4 is a diagram showing a preferred embodiment of the option fuse circuit in FIG. 3.
Figure 5:
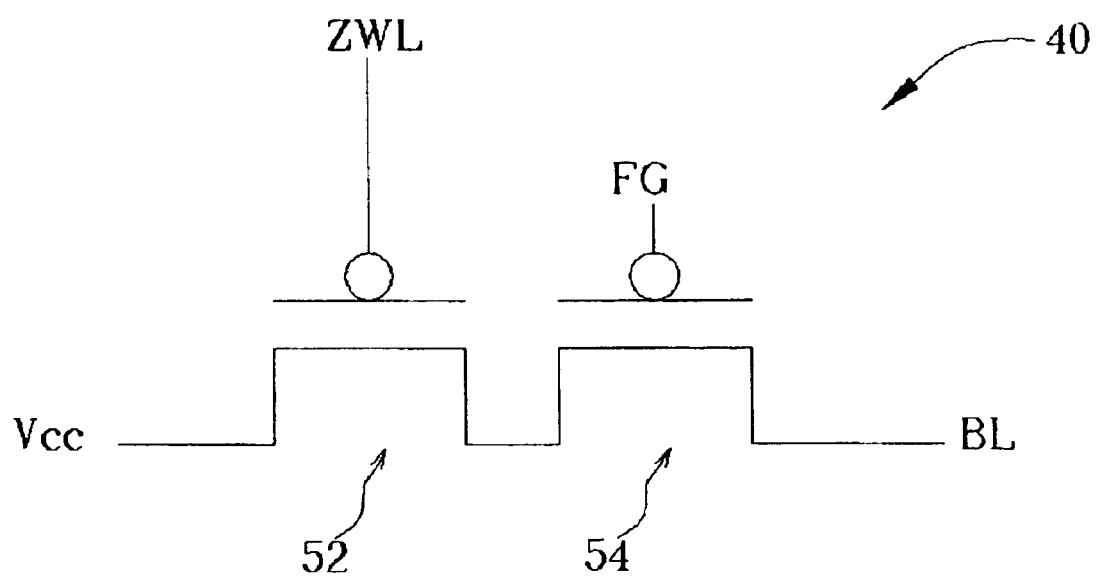
FIG. 5 is a diagram of the logic cell in FIG. 4.

Please refer to FIG. 4 and FIG. 5. FIG. 4 shows a diagram of an option fuse circuit 30 in a preferred embodiment of the present invention, whereof interconnections among devices are similar to those of the option fuse circuit 20 and therefore repeated description is unnecessary. As shown in FIG. 4, the option fuse circuit 30 comprises a latch 32, wherein a PMOS transistor 42 and an NMOS transistor 46 form an inverter, a PMOS transistor 44 and an NMOS transistor 48 form another inverter, and the two inverters are reversely connected with each other while two output nodes of the two inverters are taken as the first and the second nodes N, ZN. The option fuse circuit 30 also comprises a comparator 34, which generates a comparison signal ZWL at an output node by comparing signals from the first and the second nodes N, ZN using a plurality of logic gates, as shown in FIG. 4. The comparator 34 also comprises a mode-selecting input node ZPGM for determining whether the option fuse circuit 30 is in a program mode or in a read mode, and a data-programming input node DB for inputting data to be written when the option fuse circuit 30 is in the program mode.

The option fuse circuit 30 further comprises a first logic cell 36 and a second logic cell 38. Similar to the option fuse circuit 20 in FIG. 3, the logic cells 36, 38 are used for storing non-volatile data, wherein their word line nodes are electrically connected to the output node of the comparator 34 for inputting the comparison signal ZWL, and their bit line nodes are electrically connected to the first and the second nodes N, ZN, respectively. In this preferred embodiment, the first logic cell 36 and the second logic cell 38 are one-time programmable logic cells 40 as shown in FIG. 5. The one-time programmable logic cell 40 comprises a first transistor 52 and a second transistor 54, wherein the first and the second transistors 52, 54 are PMOS transistors. A source of the first transistor 52 is electrically connected to a power supply voltage Vcc, a gate of the first transistor 52 is used as the word line nodes of the logic cells 36, 38 (those connected to the comparison signal ZWL in FIG. 5), a drain of the first transistor is electrically connected to a source of the second transistor 54, a gate of the second transistor 54 is floating, and a drain of the second transistor 54 is used as the bit line nodes of the logic cells 36, 38 (those labeled BL in FIG. 5). The one-time programmable logic cell 40 changes an amount of electrons stored in the floating gate of the second transistor 54 by changing inputted signal values at its word line node and its bit line node, so as to change the data stored in the one-time programmable logic cell 40.

The option fuse circuit 30 further comprises an initialization module electrically connected to the first and the second logic cells 36, 38, for writing data into first and the second logic cells 36, 38 in the program mode. As shown in FIG. 4, the initialization module comprises a first initializing transistor 56 and a second initializing transistor 58, wherein the first and the second initializing transistors are NMOS transistors. Drains of the initializing transistors 56, 58 are electrically connected to the bit line nodes of the first and the second logic cells 36, 38, respectively, while sources of the initializing transistors 56, 58 are electrically connected to ground Vss (0V). The comparator 34 further comprises two initializing output nodes BL0, ZBL0 with signals of opposite phases. The initializing output nodes BL0, ZBL0 are electrically connected to gates of the first and the second initializing transistors 56, 58 respectively, and are used for controlling turn-on of the first and the second initializing transistors 56, 58 so as to write the data into the first and the second logic cells 36, 38. In the following paragraphs, mechanisms of the option fuse circuit 30 in the program mode and in the read mode will be described in detail using this preferred embodiment.

During the product-testing process, if certain memory cells in a memory cell array of a memory are found to malfunction, a program procedure of a plurality of option fuse circuits in the memory will be performed so as to select among a plurality of redundant memory cells pre-allocated in the memory to replace the malfunctioned memory cells. Here, one of the option fuse circuits will be taken as an example, and operations of the program mode of the option fuse circuit will be explained utilizing the option fuse circuit 30 in FIG. 4.

When data is to be written to the option fuse circuit 30, a low voltage level (for example 0V) is inputted from the mode-selecting input node ZPGM (which means that the option fuse circuit 30 is in the program mode), and the data to be written into the first and the second logic cells 36, 38 is inputted from the data-programming input node DB. If the data is a logical "0", then a low voltage level is outputted at the initializing output node BL0, and a high voltage level is outputted at the initializing output node ZBL0. This causes the first initializing transistor 56 to turn on and the second initializing transistor 58 to turn off, and further results in a low voltage level at the first node N and a high voltage level at the second node ZN. At the same time, since the mode-selecting input node ZPGM is a low voltage level, the comparison signal ZWL is a low voltage level, and the first transistors 52 of the first and the second logic cells 36, 38 turn on due to the low voltage level at their word line nodes. Therefore, the amounts of electrons stored in the gates of the second transistors 54 of the first and the second logic cells 36, 38 change according to voltage levels inputted at their bit line nodes. Then, the first and the second logic cells 36, 38 enter a program state (electron charges are loaded in the gate of the second transistor 54) and an erase state (electron charges are not loaded in the gate of the second transistor 54) respectively, and the data is stored in the first and the second logic cells 36, 38. Through the same reasoning, if the data inputted is a logical "1", then the first and the second logic cells 36, 38 enter the erase state and the program state, respectively, and the data is stored in the first and the second logic cells 36, 38.

After the product-testing process, a memory including the option fuse circuits having undergone the program procedure will be treated as a qualified product, and will be installed into a certain electronic device. When the electronic device using the memory turns on, a read procedure of the option fuse circuits in the memory will be performed so as to correctly select among the redundant memory cells, and to properly replace the malfunctioned memory cells with the selected redundant memory cells. As a result, the memory can function without error. Here, one of the option fuse circuits will be taken as an example, and operations of the read mode of the option fuse circuit will be explained utilizing the option fuse circuit 30 in FIG. 4.

Figure 6:
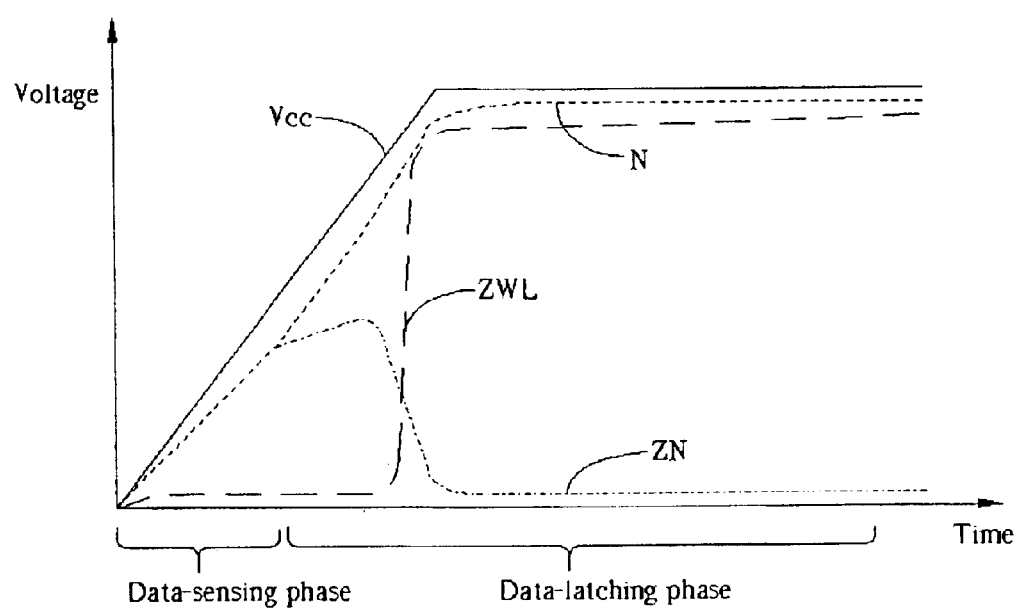
FIG. 6 is a time sequence plot of the signals in FIG. 4.

When data is to be read out from the option fuse circuit 30, a high voltage level is inputted from the mode-selecting input node ZPGM (which means that the option fuse circuit 30 is in the read mode). Hence low voltage levels are outputted at the initializing input nodes BL0, ZBL0, and this causes the first and the second initializing transistors 56, 58 to turn off. Please refer to FIG. 6. FIG. 6 shows a time sequence plot of the signal values in FIG. 4. When power is turned on, the power supply voltage Vcc increases with time until reaching a predetermined value, as shown in FIG. 6. According to operation of the option fuse circuit 30, the time sequence can be divided into a data-sensing phase and a data-latching phase. Please note that from the program procedure of the option fuse circuit 30 mentioned above, one can see that data stored in the first and the second logic cells 36, 38 must be complementary to each other. Which means if the first logic cell 36 is at the program state then the second logic cell 38 is at the erase state, and if the first logic cell 36 is at the erase state then the second logic cell 38 is at the program state.

When the option fuse circuit 30 is in the data-sensing phase, voltage values at the first and the second nodes N, ZN increase according to the power supply voltage Vcc. Since the value of the power supply voltage Vcc has not yet reached a level which will cause the voltage values of the first and the second nodes N, ZN to be different due to different states of the first and the second logic cells 36, 38, the voltage values at the first and the second nodes N, ZN both show a high voltage level. Moreover, because the mode-selecting input node ZPGM shows a high voltage level, after the operation of the logic gates in the comparator 34 as shown in FIG. 4, the comparison signal ZWL becomes a low voltage level, and hence the first transistors 52 of the first and the second logic cells 36, 38 remain turned on. Therefore, the first and the second nodes N, ZN sense the data stored in the first and the second logic cells 36, 38, respectively.

When the option fuse circuit 30 enters the data-latching phase, since the value of the power supply voltage Vcc has already reached a level which will cause the voltage values of the first and the second nodes N, ZN to be different due to different states of the first and the second logic cells 36, 38, the voltage values at the first and the second nodes N, ZN show a difference, as shown in FIG. 6 (FIG. 6 shows a situation when the first logic cell 36 is at the program state and the second logic cell 38 is at the erase state). After operation of the logic gates in the comparator 34, the comparison signal ZWL turns into a high voltage level as shown in FIG. 6, and hence the first transistors 52 of the first and the second logic cells 36, 38 become turned off. Therefore, the first and the second nodes N, ZN stop data-sensing and latch the data in the latch 32 according to the result of data-sensing (as shown in FIG. 6, the first node N shows a high voltage level and the second node ZN shows a low voltage level), and the read procedure is completed. Furthermore, the comparator 34 of the option fuse circuit 30 also comprises a signal output node Vout for outputting the data latched by the latch 32. In this preferred embodiment, since the first node N shows a high voltage level, after operation of the logic gates in the comparator 34, the signal output node Vout outputs a low voltage level, i.e. a logical "0".

Figure 7:
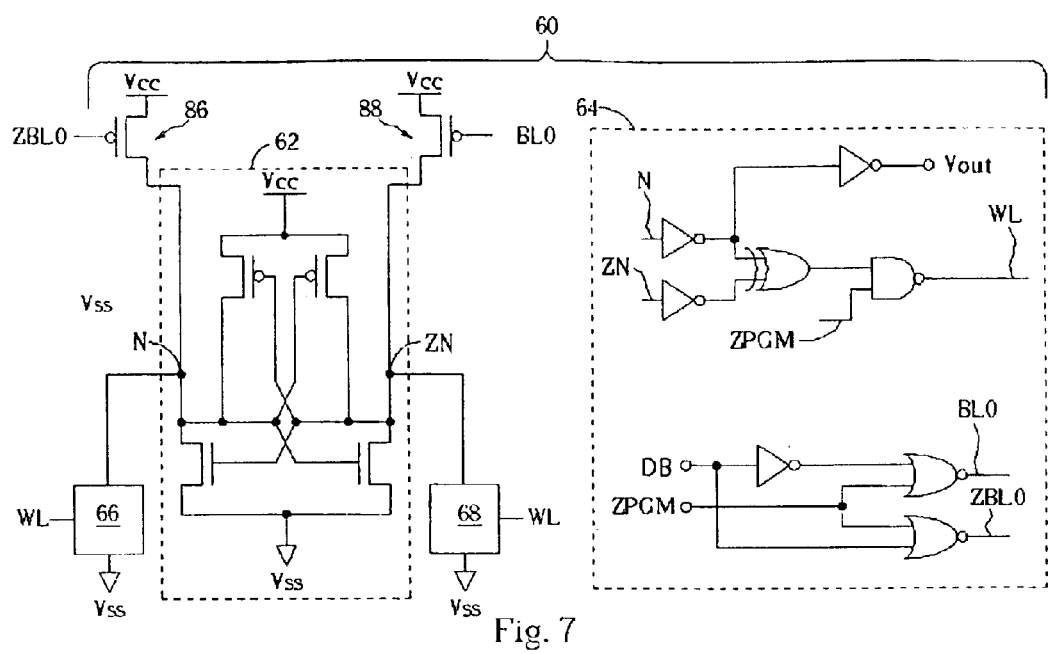
FIG. 7 is a diagram showing another preferred embodiment of the option fuse circuit in FIG. 3.
Figure 8:
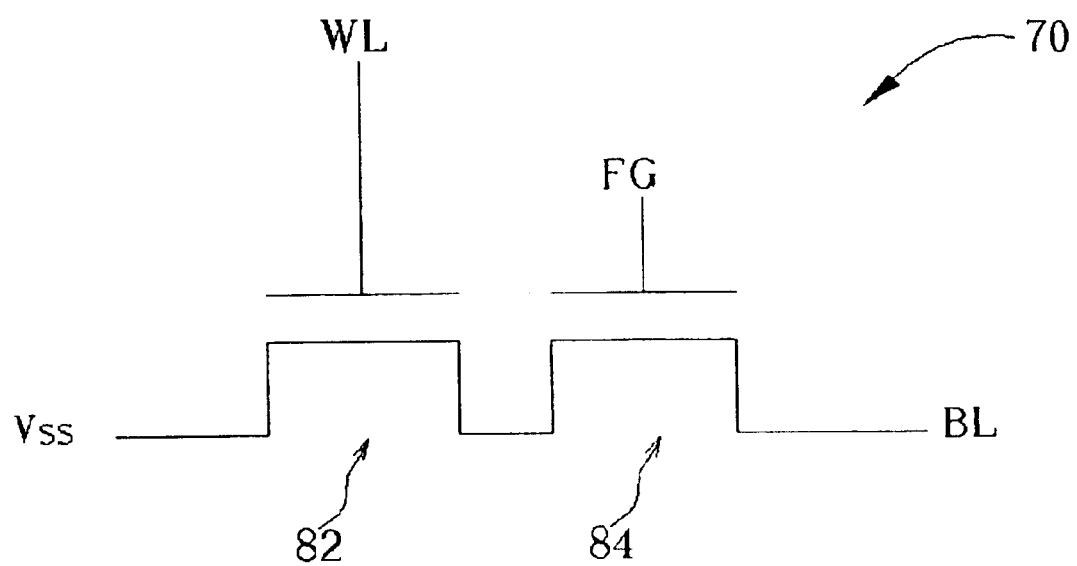
FIG. 8 is a diagram of the logic cell in FIG. 7.

Please refer to FIG. 7 and FIG. 8. FIG. 7 shows a diagram of an option fuse circuit 60 of another preferred embodiment according to the present invention. The option fuse circuit 60 comprises a latch 62, a comparator 64, a first logic cell 66, and a second logic cell 68. FIG. 8 shows a one-time programmable logic cell 70 used as the first and the second logic cells 66, 68 in FIG. 7. The one-time programmable logic cell 70 comprises a first transistor 82 and a second transistor 84, wherein the first and the second transistors 82, 84 are NMOS transistors. Interconnections among components in the option fuse circuit 60 and in the one-time programmable logic cell 70 are similar to those in the option fuse circuit 30 and in the one-time programmable logic cell 40, and hence will not be repeated in detail below. However, functions and interconnections of a plurality of logic gates in the comparator 64 are different from those in the comparator 34 according to requirement. A comparison signal WL is outputted from the comparator 64 to the first and the second logic cell 66, 68, while a source of the first transistor 82 in the one-time programmable logic cell 70 is electrically connected to ground Vss (0V). Mechanisms of the option fuse circuit 60 in the program mode and in the read mode are also similar to those of the option fuse circuit 30, and the same result can be derived following the above-mentioned description relating the option fuse circuit 30. Moreover, the option fuse circuit 60 in FIG. 7 also comprises a first initializing transistor 86 and a second initializing transistor 88, and their connections and operations are similar to those of the first and the second initializing transistors 56,58 of the option fuse circuit 30 in FIG. 4. However, the first and the second initializing transistors 86, 88 are PMOS transistors, and their sources are both electrically connected to a high voltage level (here, to Vcc).

In contrast to the prior art, the present invention option fuse circuit comprises a latch, a comparator, and two logic cells. It sets initial values into the two logic cells during a program mode, and when power turns on during a read mode, it senses data stored in the two logic cells using the latch and then outputs the data. By doing so, the problems of low reliability and long testing time caused by laser cutting according to prior art can be avoided. Furthermore, because the present invention option fuse circuit is manufactured using standard CMOS manufacturing processes, it adopts only one polysilicon layer in the process, and hence the problem of rising cost due to the use of flash memory according to prior art can also be avoided.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. An option fuse circuit manufactured with standard CMOS manufacturing processes, comprising:
    a latch comprising a first node and a second node, and being used for latching signals at the first and the second nodes;
    a comparator comprising two input nodes and an output node, wherein the two input nodes are electrically connected to the first and the second nodes respectively, the comparator being used for inputting the signals at the first and the second nodes respectively, and outputting a comparison signal by comparing the two signals;
    a first logic cell for storing a non-volatile data, comprising a first word line node and a first bit line node, wherein the first word line node is electrically connected to the output node of the comparator in order to input the comparison signal, the first bit line node being electrically connected to the first node; and
    a second logic cell for storing a non-volatile data, comprising a second word line node and a second bit line node, wherein the second word line node is electrically connected to the output node of the comparator in order to input the comparison signal, the second bit line node being electrically connected to the second node;
    wherein the data stored in the first logic cell and the data stored in the second logic cell are complementary to each other.

2. The option fuse circuit of claim 1 wherein when the option fuse circuit is in a read mode and power is turned on, a power supply voltage increases with time until reaching a predetermined value, and voltages at the first and the second nodes increase according to the power supply voltage.

3. The option fuse circuit of claim 2 wherein when the voltages at the first and the second bit line nodes are equivalent to each other during the increment, both the first and the second logic cells turn on according to the comparison signal outputted from the comparator, the first node sensing the data stored in the first logic cell, the second node sensing the data stored in the second logic cell.

4. The option fuse circuit of claim 2 wherein when the voltages at the first and the second nodes differ from each other during the increment, the first and the second logic cells turn off according to the comparison signal outputted from the comparator, the latch latching the signals at the first and the second nodes.

5. The option fuse circuit of claim 1 wherein the latch is formed by connecting two inverters reversely.

6. The option fuse circuit of claim 5 wherein each inverter is formed with a PMOS transistor and an NMOS transistor, gates of the two transistors being electrically connected to each other to form an input node of the inverter, and drains of the two transistors being electrically connected to each other to form an output node of the inverter.

7. The option fuse circuit of claim 1 wherein the comparator further comprises a plurality of logic gates for comparing the signals at the first and the second nodes, so as to output the comparison signal at the output node.

8. The option fuse circuit of claim 1 wherein the comparator further comprises a mode-selecting input node for determining whether the option fuse circuit is in a program mode or in a read mode.

9. The option fuse circuit of claim 1 wherein the comparator further comprises a data-programming input node for writing data to be written into the first and the second logic cells when the option fuse circuit is in a program mode.

10. The option fuse circuit of claim 1 wherein the first and the second logic cells are one-time programmable logic cells.

11. The option fuse circuit of claim 10 wherein the one-time programmable logic cell comprises a first transistor and a second transistor, a source of the first transistor being electrically connected to a power supply voltage or to ground, a gate of the first transistor being the word line node of the logic cell, a drain of the first transistor being electrically connected to a source of the second transistor, a gate of the second transistor floating, and a drain of the second transistor being the bit line node of the logic cell.

12. The option fuse circuit of claim 11 wherein the first and the second transistors are PMOS transistors, the source of the first transistor being electrically connected to a high-level voltage.

13. The option fuse circuit of claim 11 wherein the first and the second transistors are NMOS transistors, the source of the first transistor being electrically connected to ground (0V).

14. The option fuse circuit of claim 1 further comprising an initialization module electrically connected to the first and the second logic cells, and used for writing data to be written into the first and the second logic cells during a program mode.

15. The option fuse circuit of claim 14 wherein the initialization module comprises a first initializing transistor and a second initializing transistor, the first and the second initializing transistors being NMOS transistors, drains of the first and the second initializing transistors being electrically connected to the first and the second bit line nodes respectively, sources of the first and the second initializing transistors being electrically connected to ground, the comparator further comprising two initializing output nodes with signals of opposite phases, the two initializing output nodes being electrically connected to gates of the first and the second initializing transistors respectively, and used for controlling turn-on of the first and the second initializing transistors so as to write the data into the first and the second logic cells.

16. The option fuse circuit of claim 14 wherein the initialization module comprises a first initializing transistor and a second initializing transistor, the first and the second initializing transistors being PMOS transistors, drains of the first and the second initializing transistors being electrically connected to the first and the second bit line nodes respectively, sources of the first and the second initializing transistors being electrically connected to a high-level voltage, the comparator further comprising two initializing output nodes with signals of opposite phases, the two initializing output nodes being electrically connected to gates of the first and the second initializing transistors respectively, and used for controlling turn-on of the first and the second initializing transistors so as to write the data into the first and the second logic cells.

17. The option fuse circuit of claim 1 wherein the comparator further comprises a signal output node for outputting the signal latched by the latch.

* * * * *